United States Patent [19]

Cates

[11] Patent Number: 4,998,030

[45] Date of Patent: Mar. 5, 1991

[54] CIRCUIT TO ARBITRATE MULTIPLE REQUESTS FOR MEMORY ACCESS

[75] Inventor: Ronnie L. Cates, Tempe, Ariz.

[73] Assignee: VLSI Technology, Inc., San Jose, Calif.

[21] Appl. No.: 390,784

[22] Filed: Aug. 8, 1989

Related U.S. Application Data

[62] Division of Ser. No. 324,281, Mar. 15, 1989, abandoned.

[51] Int. Cl.⁵ .......................................... G01R 19/145
[52] U.S. Cl. .................................. 307/518; 364/900; 364/939; 364/939.4
[58] Field of Search ................. 364/200, 900; 307/518

[56] References Cited

U.S. PATENT DOCUMENTS 4,841,178 6/1989 Bisson .............................. 307/518

Primary Examiner—Gareth D. Shaw
Assistant Examiner—John G. Mills
Attorney, Agent, or Firm—Limbach, Limbach & Sutton

[57] ABSTRACT

An asynchronous arbiter circuit processes multiple different address signals that request access to the same memory location during the same memroy cycle. The circuit employs two sets of latches. The circuit recognizes access request signals and refresh request signals. For each type of request signal recognized, an associated first latch stores the value of the request signal received, and outputs a first latch output signal. An associated second latch receives the first output latch signal and translates that into a logic state that is long enough to ascertain whether additional request signals have been inputted into the circuit during the memory cycle. A delay element delays one of the request signals received prior to the signals being inputted into the cycle request logic element. The time period of the delay is determined based upon priority accorded to the particular signals.

6 Claims, 2 Drawing Sheets

CIRCUIT TO ARBITRATE MULTIPLE REQUESTS FOR MEMORY ACCESS

Cross Reference to Related Application

This is a divisional of application Ser. No. 07/324,281, filed March 15, 1989 now abandoned.

TECHNICAL FIELD

The present invention broadly relates to an interface unit which resolves identical address requests during the same memory cycle. More particularly, the invention involves an asynchronous arbiter circuit comprised of a plurality of latches and at least one delay element to resolve metastability by prioritizing and delaying the identical address requests before the requests are permitted to propagate through to the memory device.

BACKGROUND ART

It is well known that some memory devices, such as a memory controller, must support two sources of cycle requests and often receive identical address requests within the same memory cycle and it is not uncommon for the requests to conflict. When this occurs, the requests cause the set up times of the synchronous device to be violated, resulting in metastability. When metastability occurs, an analog signal is latched into the device causing oscillation of the output until the state is resolved. For example, a memory controller is required to periodically access and maintain the data stored in memory. The controller receives two types of memory requests: access requests and refresh requests and occasionally, both the access request and the refresh request, address the same memory location during the same memory cycle. Since the device is unable to resolve the identical address requests within the same memory cycle, metastability in the device results.

Arbiters are well known in the art as a means for resolving identical address requests within the same memory cycle, and hence, a means for eliminating metastability. Typically, an arbiter circuit is comprised of cross-coupled NAND gates or a flip-flop, commonly referred to as a latch. However, using a single latch permits the metastable condition to propagate into the memory control circuit. In addition, the arbiter circuit unnecessarily delays both requests by the same amount of time.

The present invention is directed toward overcoming each of the deficiencies mentioned above.

SUMMARY OF THE INVENTION

The present invention provides an asynchronous arbitration circuit for a memory controller which resolves identical memory address requests in the same memory cycle more quickly than traditional arbiter circuits, thereby preventing the circuits from going into a metastable state. The arbiter circuit of the present invention employs a double latch arrangement to prevent the metastable state from propagating through to an interfaced device while not having to delay all of the memory request signals for the same period of time.

According to the present invention, an asynchronous arbiter circuit is provided to prioritize the memory request signals directed to the same memory location during the same memory cycle, by delaying certain of the memory request signals based upon their respective priority. In the preferred embodiment, highest priority is given to the memory access request if both the memory access request and the refresh memory request occur within the same cycle. The double latch configuration provides sufficient time to determine if a memory access request is received by the circuit within a particular memory cycle. The memory request signals to be delayed are delayed after passing through the double latch configuration of the present invention.

DETAILED DESCRIPTION OF THE DRAWING

Figure 1:
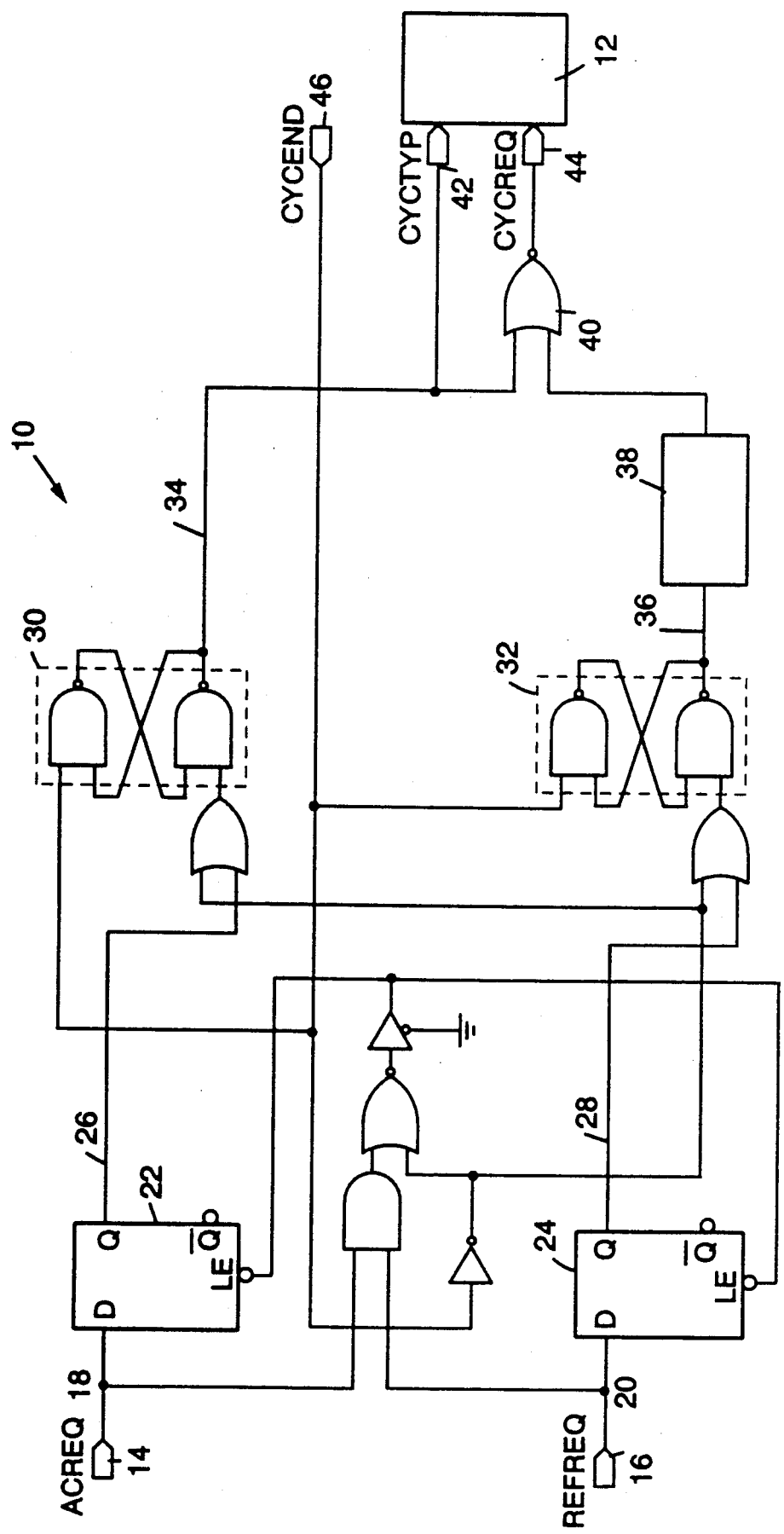
FIG. 1 is a schematic block diagram of an asynchronous arbiter circuit of the present invention.

Referring to FIG. 1, a schematic block diagram for an asynchronous arbiter circuit 10, of the present invention, particularly adapted for a memory controller, is depicted. The asynchronous arbiter circuit 10 selects and prioritizes between memory request signals occurring within the same memory cycle and requests directed to the same memory location, before the signals are allowed to reach the memory controller 12. Although, in the present embodiment, the circuit 10 is used in conjunction with a memory controller 12, the circuit 10 may also be used with other devices such as VME bus interface devices or dual port memory devices. Since, in order to maintain the data stored in memory, the DRAM memories of the memory controller 12 must be accessed periodically, the memory controller 12 is designed to support two types of memory requests: memory access requests (ACREQ) 14 and memory refresh requests (REFREQ) 16.

Each of the different types of request signals 14, 16 is received by the circuit 10 via corresponding input signal paths 18, 20, respectively. Each signal 14, 16 is input into an input latch 22, 24, there being one input latch corresponding to each type of request signal. If both the ACREQ 14 and the REFREQ signal 16 arrive at almost the same time, during the same memory cycle, and are requesting access to the same memory location, the controller 12 will go into a metastable state because the analog level of the signal into the memory controller 12 latches into a metastable state. In order to overcome this problem, the arbiter circuit 10 selects and prioritizes the identical memory request signals 14, 16, which arrive within the same cycle, but not exactly at the same time.

In the present embodiment, the access request (ACREQ) 14 is given priority over the refresh request 16 (REFREQ). As such, the arbiter circuit 10 will service the request as they are received and will give priority to the access request 14 only when the access and the refresh request 14, 16 arrive within the same cycle and both are requesting access to the same memory location.

Figure 2A:
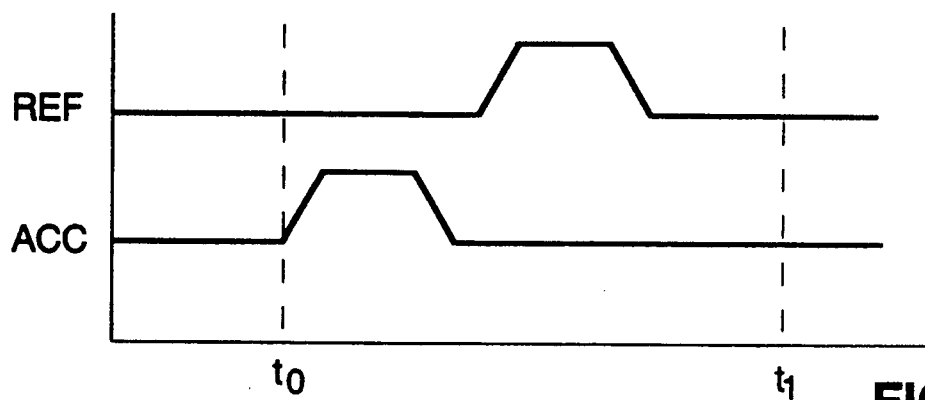
FIG. 2a is a timing diagram illustrating that during a memory cycle the access request signal input prior to the refresh signal.
Figure 2B:
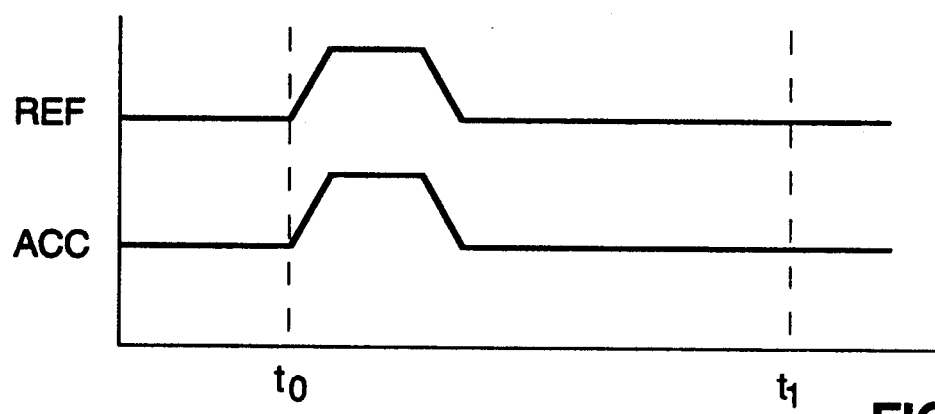
FIG. 2b is a timing diagram showing the access request and refresh request signals input simultaneously within a memory cycle.
Figure 2C:
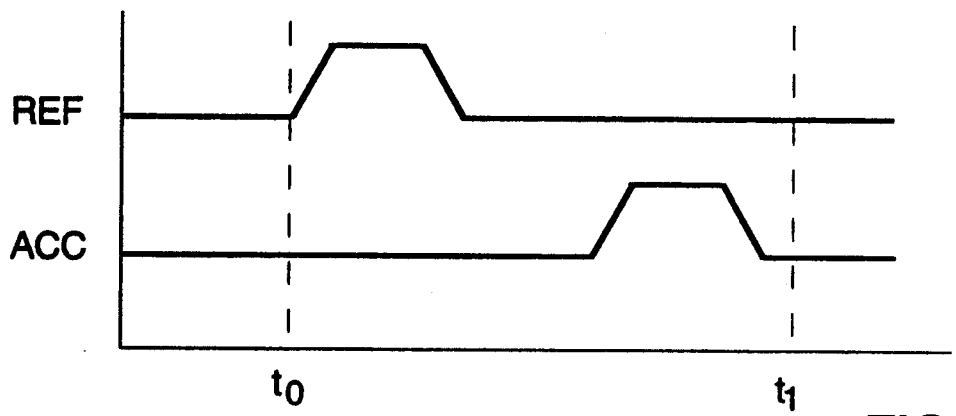
FIG. 2c depicts a timing illustrating the access request input after the refresh request but during the same memory cycle.

Reference is also made to FIGS. 2a-2c. Since the access request signal 14 is preferred, then, in all cases, it will be sent prior to the refresh request signal 16. Referring to FIG. 2a, for example, if the access request 14 is received first, before the refresh request 16 is received, the access request 14 is performed first. Referring to FIG. 2b, if the access request 14 and the refresh request 16 arrive simultaneously within the same clock cycle, the access request 14 takes precedence and is performed first. In the double latch configuration, if, as illustrated in FIG. 2c, during the memory cycle, the refresh request 16 is sent first, but the access request 14 is sent within the same memory cycle, the access request 14 will take precedence and be performed over the refresh request 16.

The present invention avoids metastability by employing a double latching system 22, 24, 30, 32 for each unique memory request signal path. Each of the request signals 14, 16 are input into a first set of latches, input latches 22, 24, there being one input latch associated with each memory request signal path. The input latches 22, 24 may be conventional D-type flip-flops, such as the HC75. Each input latch 22, 24 stores the value of the request signal 14, 16 that it receives and generates a corresponding latch output signal 26, 28 which reflects the output characteristics associated with the D flip-flop.

Each of the latch output signals 26, 28 is then input into a second set of latches, the metastable latches 30, 32, there being one metastable latch 30,32 for each of the memory request signal path. The second set of latches are cross-coupled NAND gates 30,32 or they may be any equivalent thereof so long as any metastable oscillation below the threshold level of the logic circuity will be filtered by setting the latches 30, 32.

The metastable latches 30,32 translate the latch output signals 26, 28 into logic states that are long enough to determine if an access request signal has been input during the memory cycle prior to permitting the refresh request signal 16 to propagate through to the memory controller 12. As previously discussed, since priority is given to the access request 14, the output of the metastable latch associated with the refresh request signal 36 is delayed by a delay element 38 prior to the request signal being input into the cycle request logic element 40. The delay is added to the slow signal path. Typically, the access request 14 is faster than the refresh request 16 having rates of 2 MHz and 64 KHz, respectively.

The delay element 38 is comprised of a preselected number of inverters. The required number of inverters, and hence, the period of the delay is selected upon the time that it takes for the latches 22, 24, 30, 32 to resolve metastability. For CMOS, for example, the delay is approximately 50 ns.

The access request metastable latch output 34 is not delayed prior to being input into the cycle request logic element 40. The output 34 also serves as the cycle type (CYCTYP) 42 input signal. The CYCTYP 42 is input into the memory controller 12 and notifies the controller 12 of the type of request signal received. If the CYCTYP 42 is a 1, then the signal received is an access request signal; if the CYCTYP is a 0, then the signal received is a refresh request signal. The cycle request logic element 40 is a NOR gate. The cycle request logic element 40 outputs the cycle request (CYCREQ) signal 44 which activates the cycle for the memory controller 12. The CYCEND signal 46 resets the latches 22, 24, 30, 32 to cleanse them of their previous states prior to beginning a new cycle.

The present invention is advantageous because only one of the two request signals is delayed and the signal is only delayed if the two requests occur within the same memory cycle and the requests are directed to the same memory location. In addition, arbiter circuit 10 does not permit the metastability to propagate into the control circuitry 12.

What is claimed is:

1. An asynchronous arbitration circuit means for selecting and prioritizing between a first request signal and a second request signal to a memory control circuit means when the first and second request signals occur within the same memory cycle and the first and second request signals request access to the same memory location, wherein the improvement comprises:

a plurality of input latch means, there being one input latch means for receiving and storing one of the first and second request signals, and each of the input latch means outputs a first or a second latch output signal corresponding to the first or the second request signal received, respectively;

a plurality of metastable latch means there being one metastable latch means for receiving a first or a second latch output signal, for storing the received first or second latch output signal, and for outputting a first or a second metastable latch output signal corresponding to the first or the second latch output signal received, respectively;

at least one delay means for said first metastable latch output signal for delaying the first metastable latch output signal for a preselected time period and for producing an output delayed signal in response thereto; and means for receiving the output delayed signal and the second metastable latch output signal and for signalling to the memory control circuit means if the second metastable latch output signal is present during the cycle.

2. The arbitration circuit of claim 1 wherein, the first request signal corresponds to a refresh memory request signal and the second request signal corresponds to an access memory request signal.

3. The arbitration circuit of claim 1 wherein at least one of the latch output signals is one of a plurality of metastable latch input signals.

4. The circuit of claim 1 wherein the metastable latch means is comprised of a cross coupled NAND gate means.

5. The circuit of claim 1 wherein the time period of the delay means corresponds to the length of time that it takes to resolve metastability.

6. The arbitration circuit of claim 2 wherein the second request signal has priority over the first request signal such that the one metastable latch output signal corresponds to the first request signal.

* * * * *